United States Patent
Nagata

(10) Patent No.: US 11,622,052 B2
(45) Date of Patent: Apr. 4, 2023

(54) APPARATUS, FACSIMILE COMMUNICATION APPARATUS, AND CONTROL METHOD

(71) Applicant: CANON KABUSHIKI KAISHA, Tokyo (JP)

(72) Inventor: Ken Nagata, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/328,418

(22) Filed: May 24, 2021

(65) Prior Publication Data

US 2021/0377404 A1   Dec. 2, 2021

(30) Foreign Application Priority Data

May 29, 2020   (JP) .............................. JP2020-094487

(51) Int. Cl.
  *H04N 1/00*   (2006.01)
  *H03K 7/08*   (2006.01)
(52) U.S. Cl.
  CPC ........... *H04N 1/00488* (2013.01); *H03K 7/08* (2013.01); *H04N 1/00477* (2013.01)
(58) Field of Classification Search
  CPC ... H04N 1/00488; H04N 1/00477; H03K 7/08
  See application file for complete search history.

(56) References Cited

U.S. PATENT DOCUMENTS

2012/0249202 A1* 10/2012 Somayajula ............. H03K 7/08
  327/172
2013/0321254 A1* 12/2013 Kim ..................... G09G 3/2014
  345/102
2019/0165790 A1*  5/2019 Choi ........................ H03K 7/08

FOREIGN PATENT DOCUMENTS

JP          2014-40172 A     3/2014

OTHER PUBLICATIONS

Chang et. al. (Kuo-Tsai Chang, Hsuang-Chang Chiang, Chun-Wei Lee, Design and implementation of a piezoelectric clutch mechanism using piezoelectric buzzers, Sensors and Actuators A: Physical, vol. 141, Issue 2, 2008, pp. 515-522, ISSN 0924-4247, https://doi.org/10.1016/j.sna.2007.10.018. (Year: 2007).*

* cited by examiner

*Primary Examiner* — John W Poos
*Assistant Examiner* — Tyler J Pereny
(74) *Attorney, Agent, or Firm* — Canon U.S.A., Inc. IP Division

(57) ABSTRACT

An apparatus includes: a generation unit that generates a PWM wave based on a sound signal; and a processing unit that converts the PWM wave to a square wave. The processing unit includes: a first counter that determines a pulse width of the PWM wave; a comparison unit that compares a first difference value, obtained by subtracting the pulse width in a second cycle being a cycle immediately preceding a first cycle from the pulse width in the first cycle, and a second difference value obtained by subtracting the pulse width in a cycle immediately preceding the second cycle from the pulse width in the second cycle; and an output unit that outputs the square wave while switching a state thereof in a case where a sign of the first difference value changes from that of the second difference value.

18 Claims, 15 Drawing Sheets

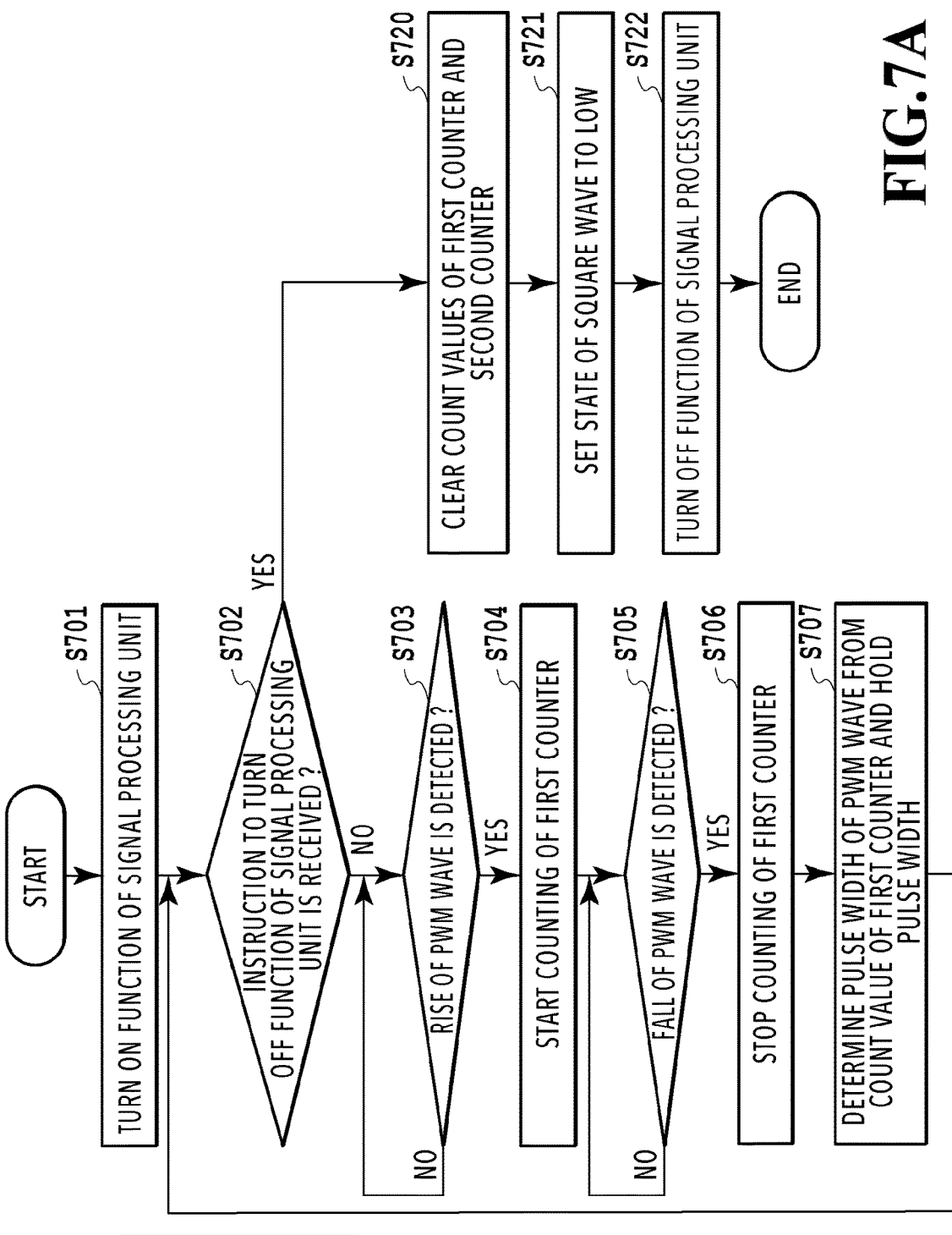

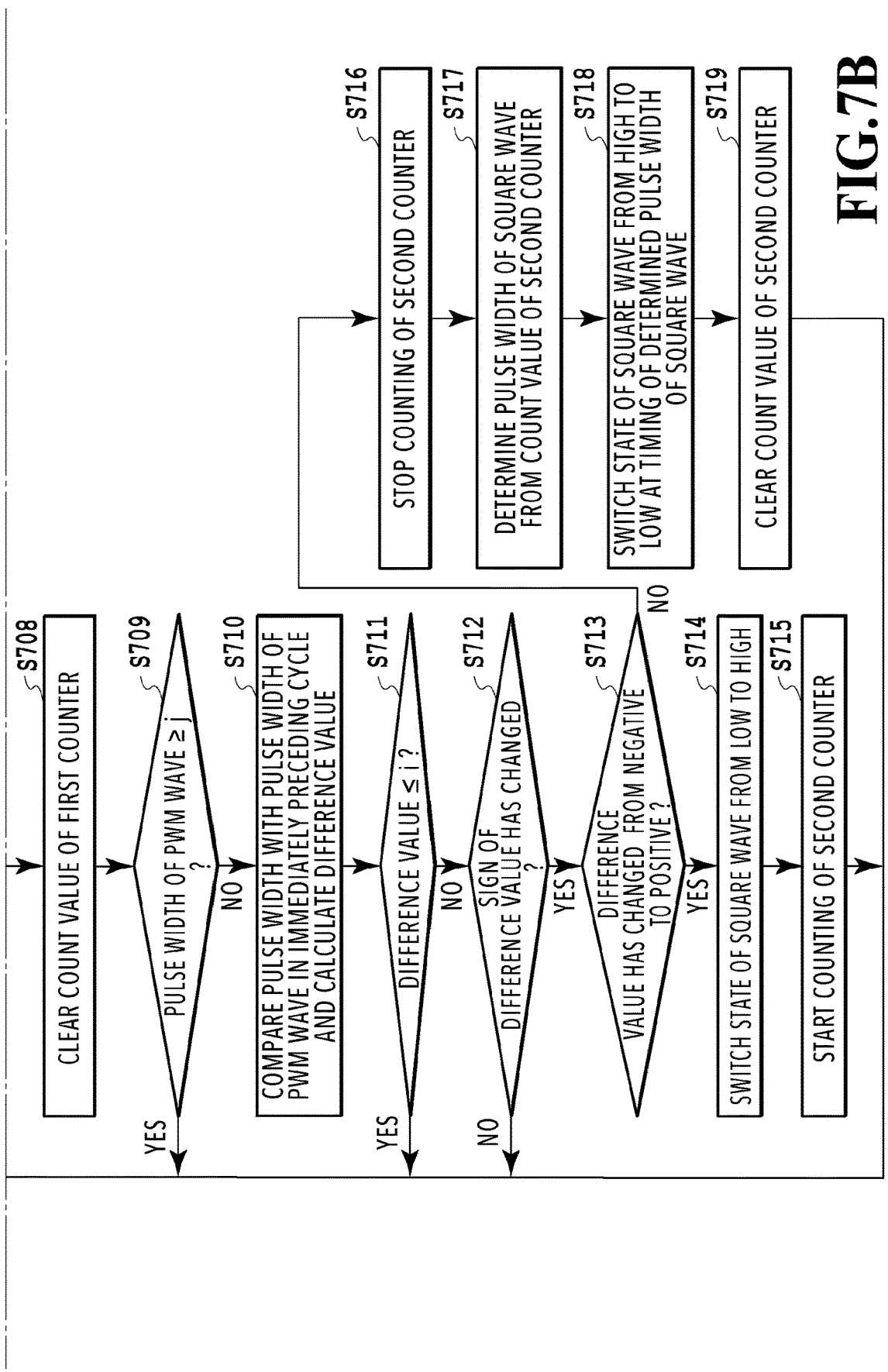

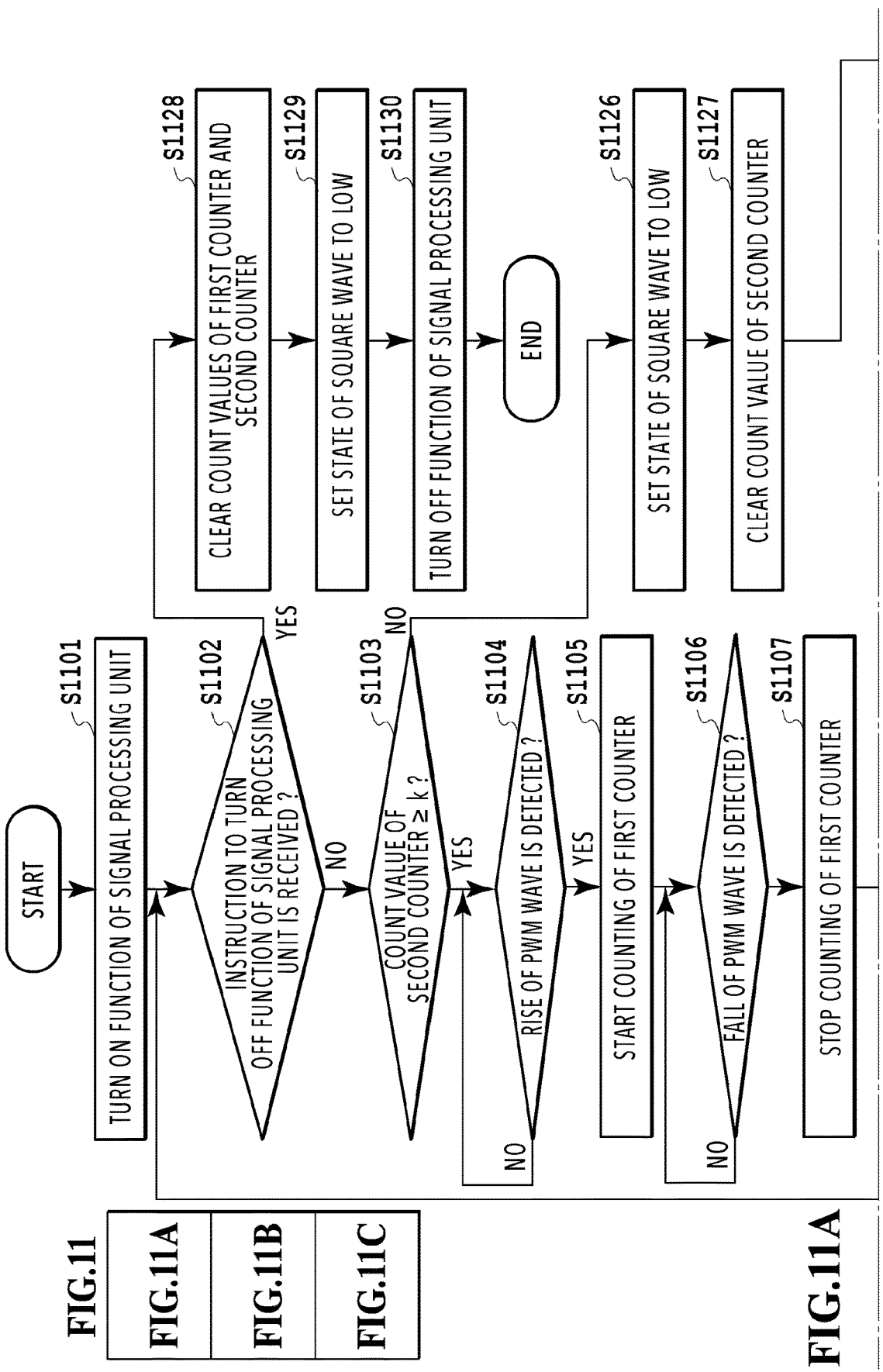

APPARATUS, FACSIMILE COMMUNICATION APPARATUS, AND CONTROL METHOD

BACKGROUND OF THE DISCLOSURE

Field of the Disclosure

The aspect of the embodiments relates to an apparatus, a facsimile communication apparatus, and a control method.

Description of the Related Art

In an apparatus provided with a buzzer such as a facsimile communication apparatus, a volume and a frequency component of a communication sound are expressed by one signal. This signal is a pulse width modulation wave (hereinafter, referred to as PWM wave).

Japanese Patent Laid-Open No. 2014-40172 describes an apparatus that outputs a notification sound based on a PWM wave by using a low-pass filter, a filter that cuts a DC component, and an amplifier.

However, the apparatus of Japanese Patent Laid-Open No. 2014-40172 requires the filters and the amplifier and a circuit is complex.

SUMMARY OF THE DISCLOSURE

An apparatus is a buzzer control apparatus that controls a buzzer by using a square wave, comprising: a generation unit configured to generate a PWM wave based on a sound signal; and a processing unit configured to convert the generated PWM wave to the square wave. The processing unit includes: a first determination unit configured to determine a pulse width of the PWM wave; a comparison unit configured to compare a first difference value and a second difference value, the first difference value obtained by subtracting the pulse width of the PWM wave in a second cycle from the pulse width of the PWM wave in a first cycle, the second cycle being a cycle immediately preceding the first cycle, the second difference value obtained by subtracting the pulse width in a cycle immediately preceding the second cycle from the pulse width in the second cycle; and an output unit configured to output the square wave while switching a state of the square wave in a case where a sign of the first difference value changes from a sign of the second difference value.

Further features of the present disclosure will become apparent from the following description of exemplary embodiments with reference to the attached drawings.

BRIEF DESCRIPTION OF THE DRAWINGS

FIG. 7 is a diagram showing the relationship of FIG. 7A and FIG. 7B;

FIG. 7A is a flowchart illustrating processing of obtaining a square wave from a PWM wave and outputting the square wave;

FIG. 7B is a flowchart illustrating processing of obtaining a square wave from a PWM wave and outputting the square wave;

FIG. 9 is a diagram showing the relationship of FIG. 9A and FIG. 9B;

FIG. 11 is a diagram showing the relationship of FIG. 11A, FIG. 11B, and FIG. 11C;

FIG. 11A is a flowchart illustrating processing of obtaining the square wave from the PWM wave and outputting the square wave;

DESCRIPTION OF THE EMBODIMENTS

Embodiments for carrying out a technique of the present disclosure are described below by using the drawings. Note that the following embodiments do not limit the disclosure according to the scope of claims and not all of the combinations of the characteristics described in the following embodiments are necessary for solving means in the technique of the present disclosure.

First Embodiment

An embodiment is described below by using an image forming apparatus with a facsimile function as an example. Note that the method of the embodiment can be applied not only to the image forming apparatus but also to other apparatuses including a buzzer.

[Regarding Configuration of Image Forming Apparatus]

Figure 1:
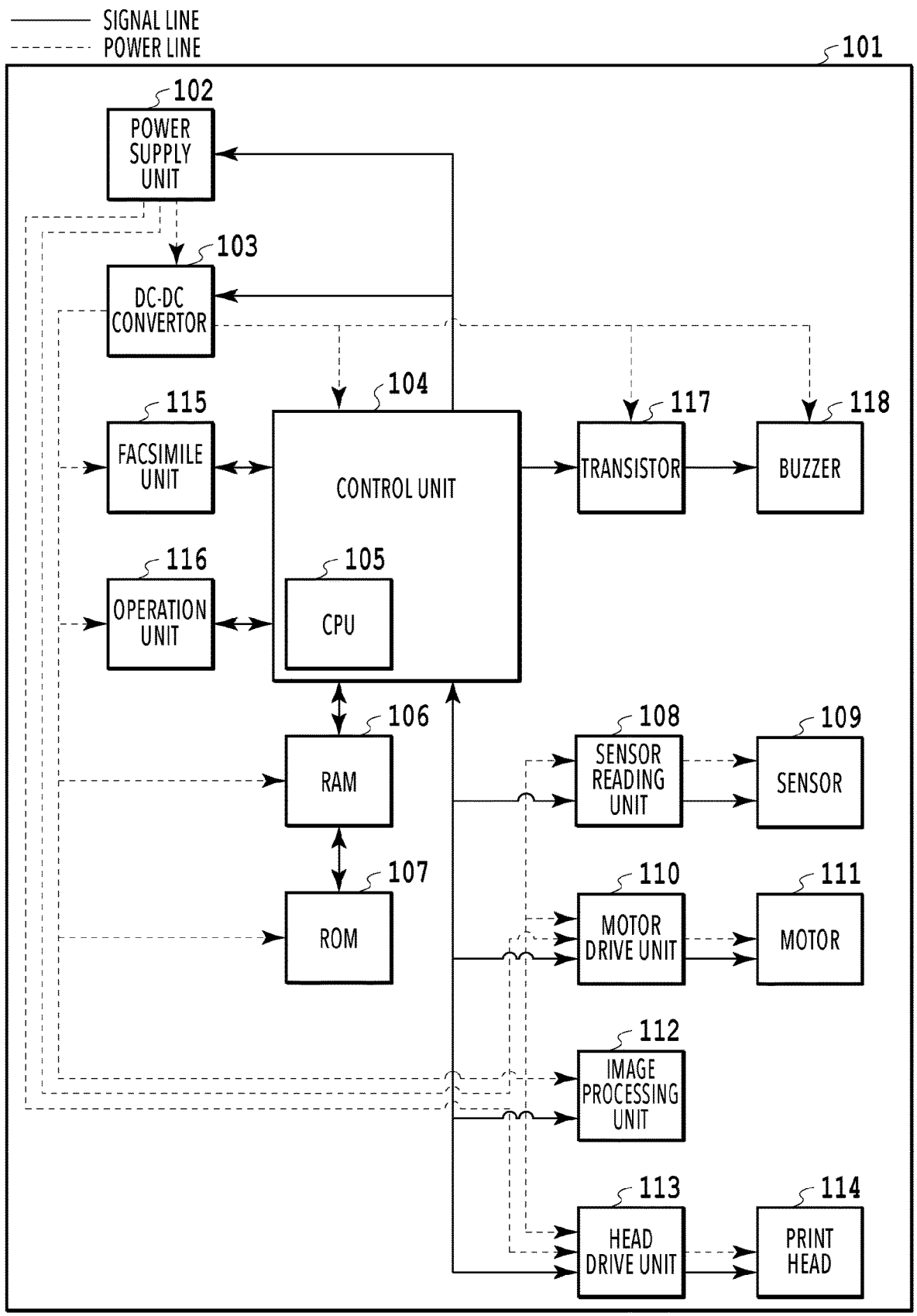
FIG. 1 is a block diagram illustrating a configuration of an image forming apparatus with a facsimile function.

FIG. 1 is a diagram for explaining a configuration of the image forming apparatus 101 with the facsimile function in the embodiment. In other words, the image forming apparatus 101 functions also as a facsimile communication apparatus. Units forming the image forming apparatus 101 are connected one another via power lines and signal lines.

There are two systems of power lines. In one system, power is sent from a power supply unit 102 to a DC-DC convertor 103 and a motor drive unit 110. The DC-DC convertor 103 performs voltage conversion and sends power to various units. The motor drive unit 110 supplies power to a motor 111 in motor driving. In the other system, power is supplied from the power supply unit 102 to a head drive unit 113 and is used for driving of a print head 114.

A control unit 104 includes a central processing unit (CPU) 105 and controls the signal lines. The CPU 105 performs calculation processing depending on an operation sequence and performs control of switching output voltage modes of the power supply unit 102 and the DC-DC convertor 103. Note that, although the control unit 104 of the embodiment includes a signal processing unit 306 and a switching unit 309 (see FIG. 3), these units are omitted in FIG. 1.

A random-access memory (RAM) 106 temporarily holds necessary data. A read-only memory (ROM) 107 stores necessary data. A sensor reading unit 108 transmits a result detected by a sensor 109 to the control unit 104 depending on the operation sequence. The motor drive unit 110 drives the motor 111 depending on the operation sequence. An image processing unit 112 converts image data to print data depending on the operation sequence. The print data is sent to the head drive unit 113 via the control unit 104. The head drive unit 113 performs a print operation by driving the print head 114 depending on a print mode.

A facsimile unit 115 includes a data access arrangement (DAA) 121 and a modem 122 (not illustrated in FIG. 1, illustrated in FIGS. 2 and 3) and communicates with the control unit 104 to exchange information on a telephone line and information on images to be exchanged. An operation unit 116 sends information based on an operation by a user to the control unit 104. A buzzer 118 generates sound to notify the user of a status of the operation by the user and a communication status of the telephone line. A transistor 117 drives the buzzer 118 depending on a control signal inputted into the transistor 117.

[Regarding Drive of Buzzer in Comparative Example]

Figure 2:
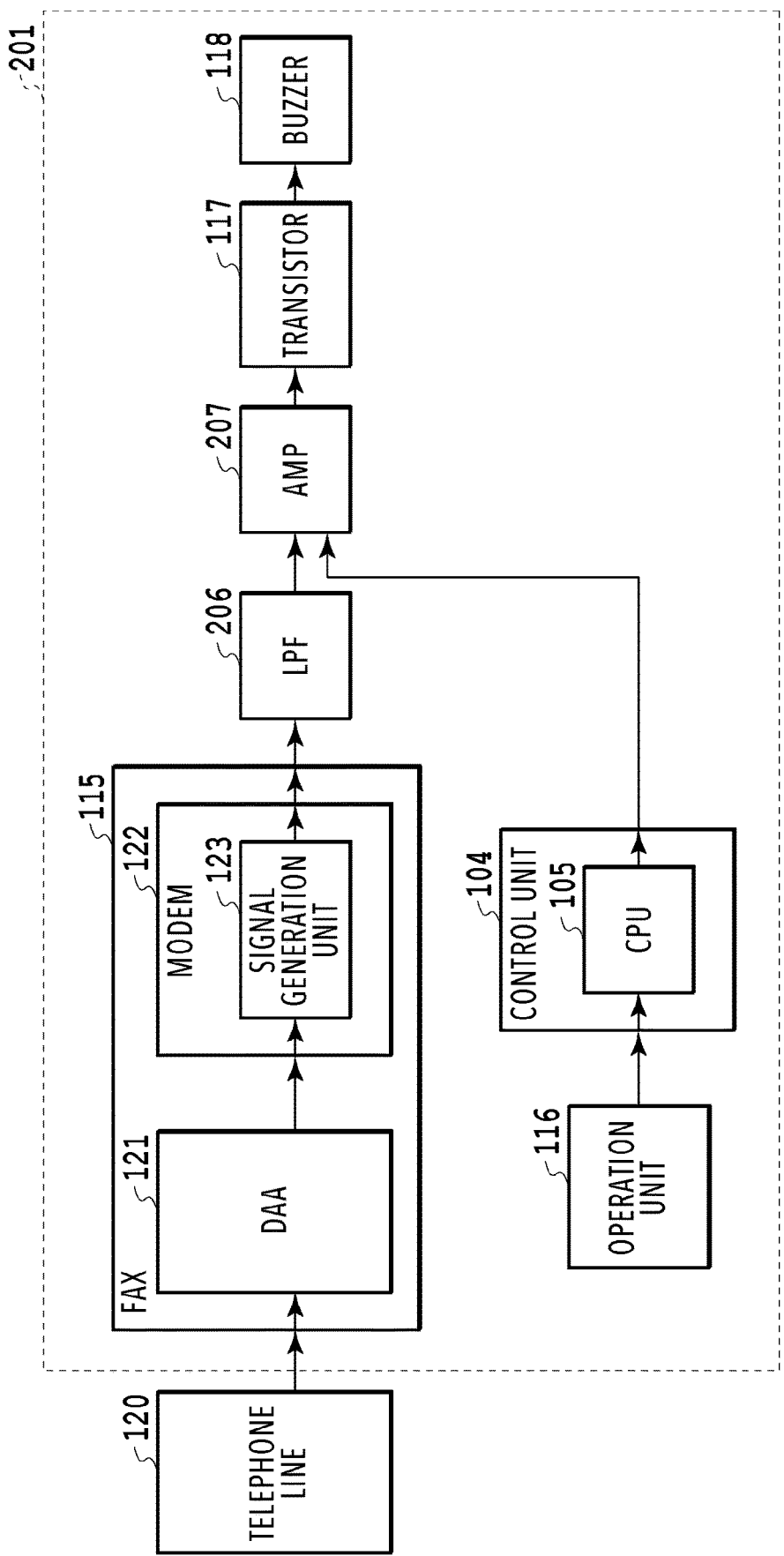
FIG. 2 is a diagram for explaining buzzer driving in an image forming apparatus of a comparative example.

FIG. 2 is a block diagram for explaining functions of units in an image forming apparatus 201 of a comparative example with a facsimile function in buzzer driving. In FIG. 2, only the units that function in the buzzer driving are illustrated among the units forming the image forming apparatus 201. Note that the units having the same functions as those in the image forming apparatus 101 of the embodiment are denoted by the same reference numerals as those in FIG. 1.

In facsimile communication, a sine wave that is a sound signal is sent from a telephone line 120 to the image forming apparatus 201. Since there is a possibility that a voltage of the sent sound signal is excessively high, the DAA 121 provided in the facsimile unit 115 and having a high withstanding voltage receives the sound signal and information on the sound signal received by the DAA 121 is sent to the modem 122 in the facsimile unit 115. Then, a signal generation unit 123 in the modem 122 converts the sound signal to a PWM wave. The configuration described above is the same also in the image forming apparatus 101 of the embodiment.

In the image forming apparatus 201 of the comparative example, a low-pass filter (hereinafter, referred to as LPF) 206 restores the PWM wave to the sine wave. An amplifier (hereinafter, referred to as AMP) 207 amplifies the sine wave restored by the LPF 206 to generate a square wave. The transistor 117 controls on and off of the buzzer 118 depending on the generated square wave and the buzzer 118 generates sound at a predetermined frequency to notify the user.

Moreover, the CPU 105 generates a square wave depending on an operation by the user on the operation unit 116 to generate an operation sound. The AMP 207 amplifies the sine wave to generate the square wave, the transistor 117 controls on and off of the buzzer 118 depending on the generated square wave, and the buzzer 118 generates sound at a predetermined frequency to generate the operation sound.

As described above, in the image forming apparatus 201 of the comparative example, the PWM wave is converted to the sine wave and then converted to the square wave. In the method of the comparative example, the sine wave restored by the LPF 206 is a minute signal. Accordingly, in the case where the values of the frequency of the sine wave and the frequency of a reference clock of the PWM wave are close to each other, the reference clock of the PWM wave remains in the sine wave restored by the LPF 206 as noise. Moreover, since the sine wave restored by the LPF 206 is a minute signal, an amplifying circuit is included. A simple circuit using a comparator cannot achieve the amplification of the minute signal including noise and an amplification circuit using the AMP 207 converts the sine wave to the square wave. Accordingly, in the image forming apparatus 201 of the comparative example, the filter and the amplifying circuit are used and this causes an increase in the number of elements and leads to a more complex circuit.

[Regarding Buzzer Driving in Embodiment]

Figure 3:
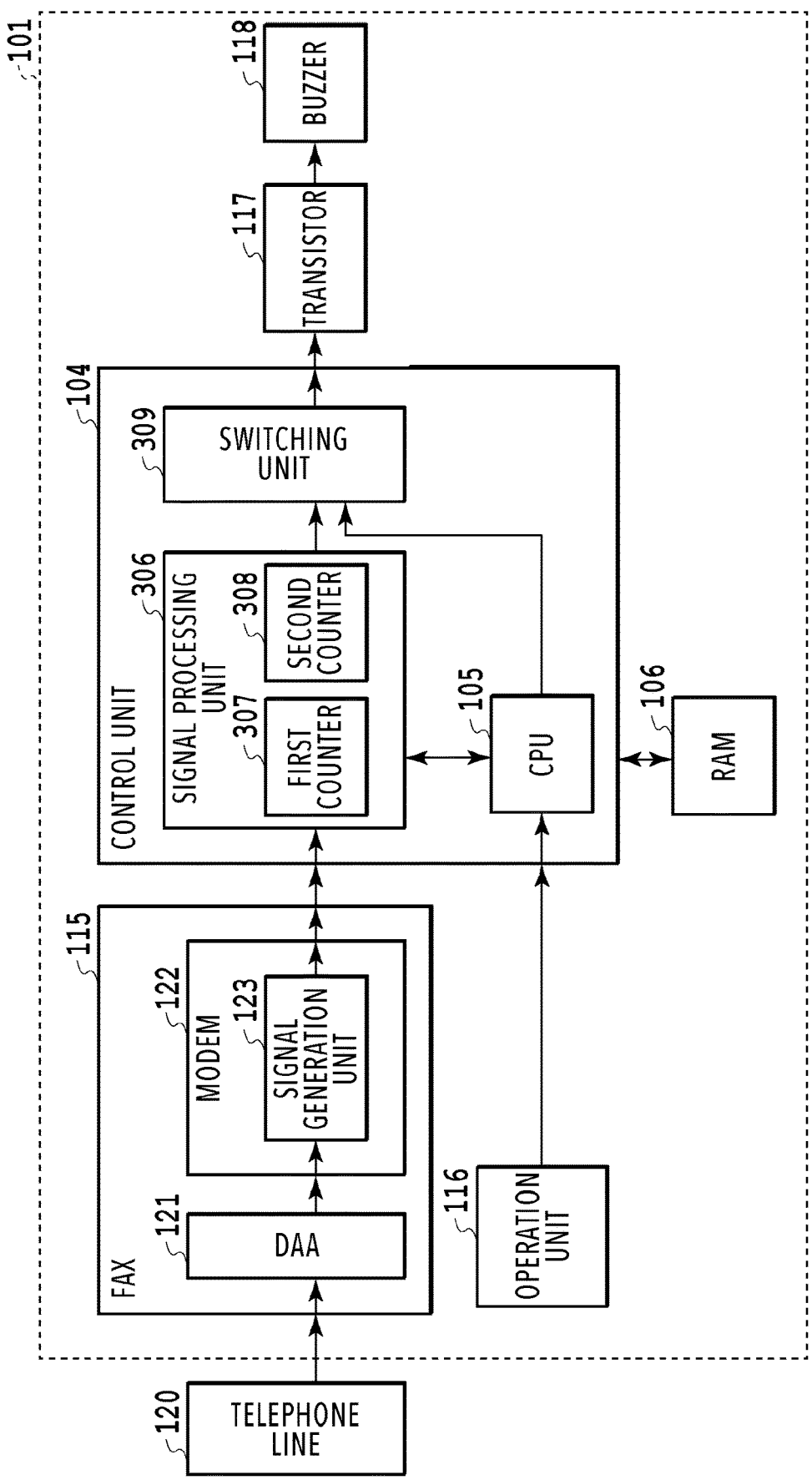
FIG. 3 is a diagram for explaining buzzer driving in the image forming apparatus.

FIG. 3 is a block diagram for explaining functions of the units in the image forming apparatus 101 of the embodiment in the buzzer driving. In FIG. 3, only the units that function in the buzzer driving are illustrated among the units 102 to 118 forming the image forming apparatus 101.

An operation of the facsimile unit 115 is the same as that in the comparative example of FIG. 2. In the image forming apparatus 101 of the embodiment, the signal processing unit 306 in the control unit 104 receives a PWM wave generated in the signal generation unit 123 in the facsimile unit 115. The signal processing unit 306 includes a first counter 307 for reading changes in an increase and a decrease of a pulse width of the PWM wave. Moreover, the signal processing unit 306 includes a second counter 308 for counting the pulse width of an outputted square wave. The signal processing unit 306 generates the square wave depending on the frequency of a sine wave by using the first counter 307 and the second counter 308 and outputs the square wave to the transistor 117. The flow of the square wave from the transistor 117 to the buzzer 118 is the same as that in the comparative example. The RAM 106 is used to hold the pulse width of the PWM wave and the pulse width of the square wave.

The switching unit 309 performs switching between an operation sound and a communication sound of the telephone line to perform switching to a sound to be generated in each case. Providing the switching unit 309 that performs switching between a line used to generate the operation sound and a line used to generate a sound signal of the telephone line enables generation of the operation sound and the sound based on the sound signal of the telephone line with one buzzer and can reduce the complexity of the circuit.

Figure 4:
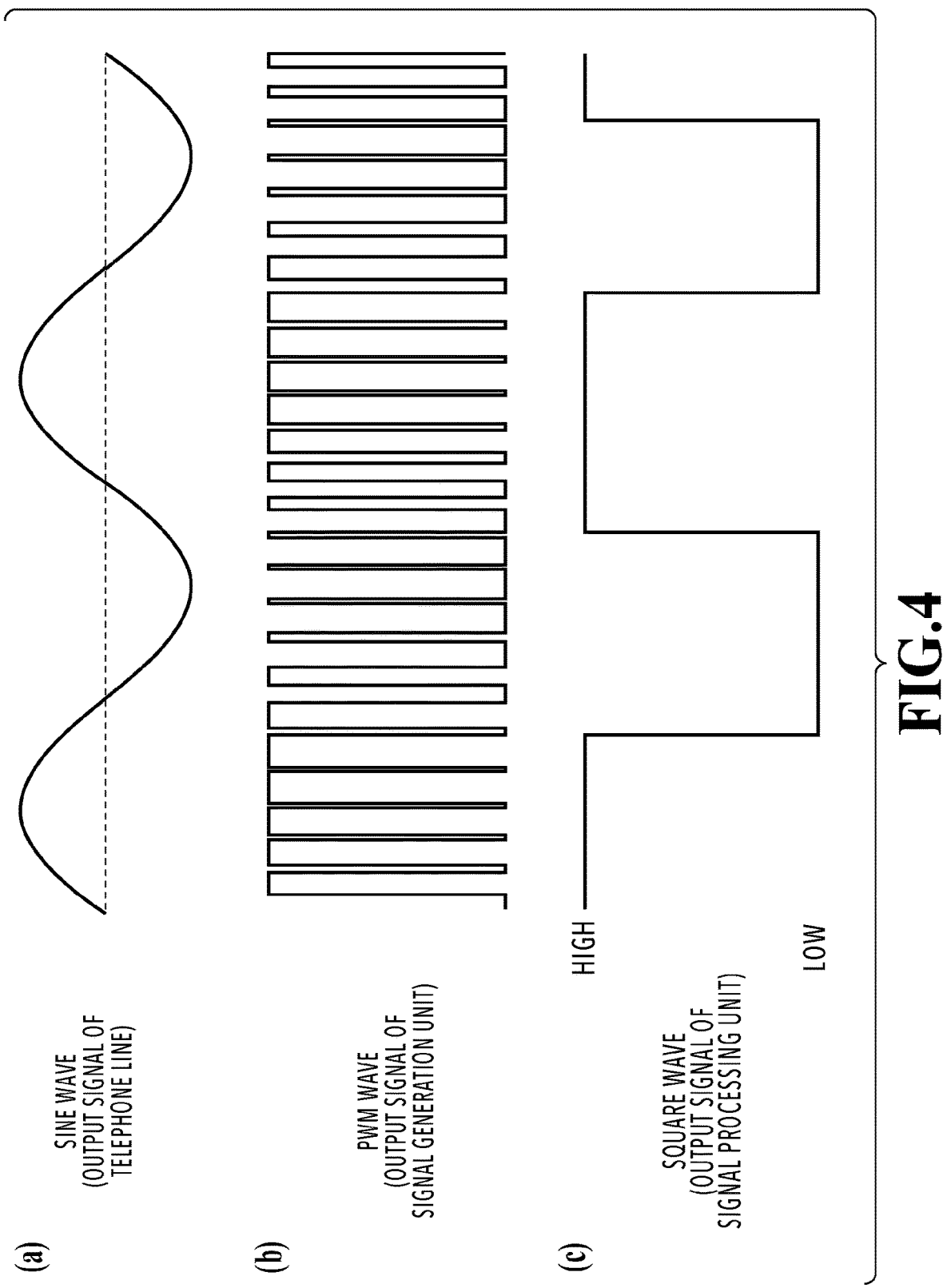
FIG. 4 is a diagram illustrating waveforms of signals in a sound signal line.

FIG. 4 is a diagram for explaining waveforms of signals in a sound signal line. FIG. 4(a) is a diagram illustrating a sine wave that is the sound signal outputted from the telephone line 120. FIG. 4(b) is a diagram illustrating a PWM wave that is the signal outputted from the signal generation unit 123. FIG. 4(c) is a diagram illustrating a square wave that is the signal outputted from the signal processing unit 306 of the embodiment. It can be found from the waveforms of FIG. 4 that the frequency of the square wave in FIG. 4(c) is the same as the frequency of the sine wave in FIG. 4(a). Note that an actual output signal of the telephone line 120 is a signal subjected to DC biasing.

Figure 5:
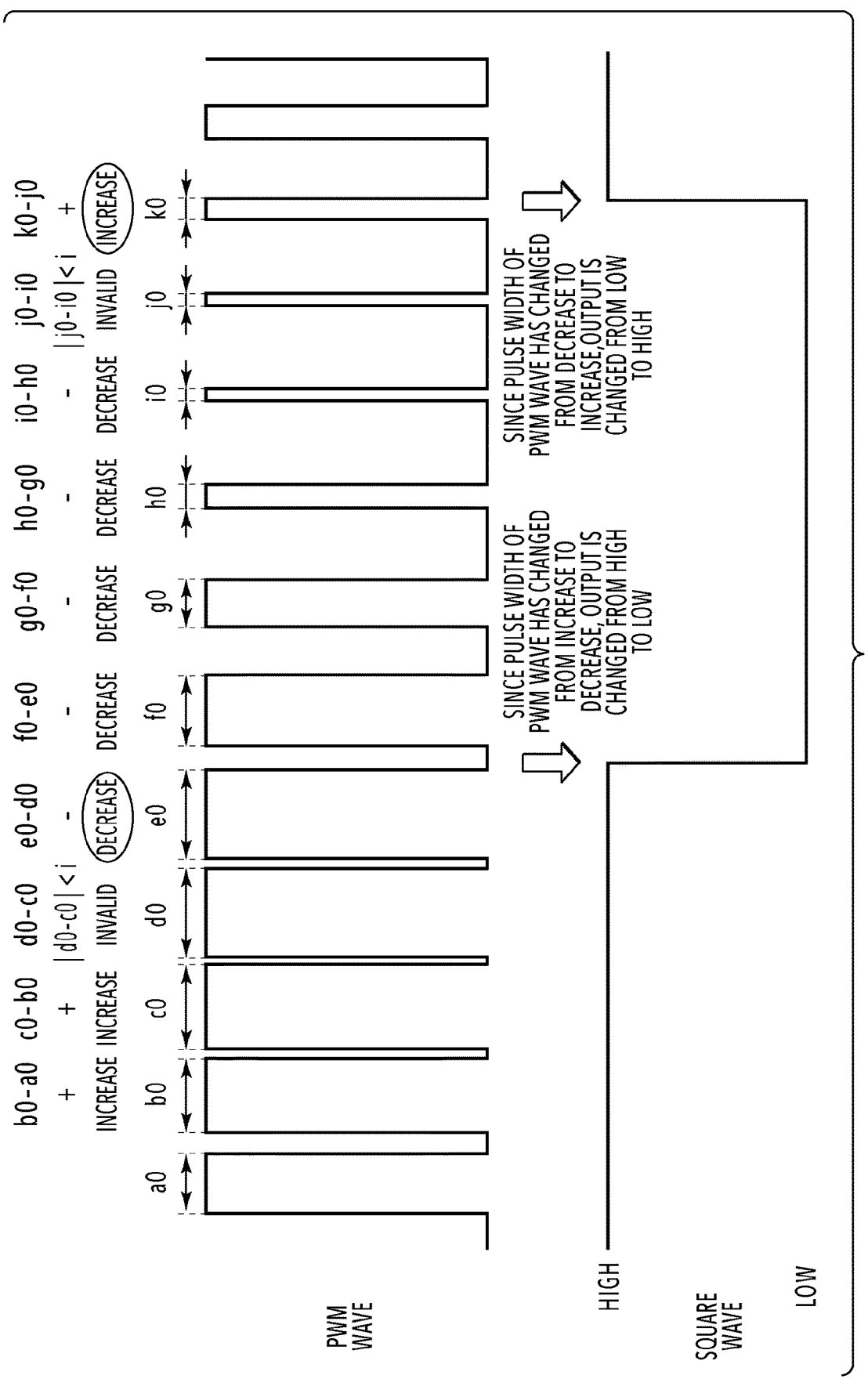
FIG. 5 includes diagrams illustrating waveforms of signals in the sound signal line.

FIG. 5 includes diagrams for explaining generation of the square wave by the signal processing unit 306 in the embodiment. The upper graph in FIG. 5 is a diagram illustrating a PWM wave that is the signal outputted from the signal generation unit 123 and the lower graph in FIG. 5 is a diagram illustrating a square wave that is the signal outputted from the signal processing unit 306 based on the PWM wave. In the embodiment, the signal processing unit 306 obtains a pulse width of the PWM wave and a pulse width in the immediately preceding cycle, calculates a difference value between the obtained pulse widths, generates the square wave based on the difference value, and outputs the square wave. The calculation of the pulse width of the PWM wave by the signal processing unit 306 is performed based on a count value obtained as a result of causing the first counter 307 to count time (pulse width) in which the state of the PWM wave is high.

The generation of the square wave by the signal processing unit 306 is described by using FIG. 5. First, in the case where the pulse width of the PWM wave counted by the first counter 307 is a pulse width b0, the signal processing unit 306 compares the pulse width b0 with a pulse width a0 of a pulse in the cycle immediately preceding the cycle of the pulse with the pulse width b0. Then, the signal processing unit 306 subtracts the pulse width a0 from the pulse width b0 and calculates a difference value b0-a0. In FIG. 5, the sign of the difference value b0-a0 is +(plus) and the pulse width of the PWM wave has increased from the pulse width of the pulse in the immediately preceding cycle. In this case, the signal processing unit 306 outputs the square wave while setting the state of the square wave to high. In the next cycle, since the sign of a difference value c0-b0 between a pulse width c0 in this cycle and the pulse width in the immediately preceding cycle is also+(plus), the signal processing unit 306 outputs the square wave while maintaining the state of the square wave to high.

In the case where the pulse width of the pulse of the PWM wave counted by the first counter 307 is a pulse width e0, the signal processing unit 306 subtracts a pulse width d0 of a pulse in the immediately preceding cycle from the pulse width e0 and calculates a difference value e0-d0. As illustrated in FIG. 5, the sign of the difference value is − (minus) and the pulse width of the PWM wave has decreased from the pulse width of the pulse in the immediately preceding cycle. In the case where the sign of the difference value has changed from plus to minus, the PWM wave is switched and the signal processing unit 306 thus switches the state of the square wave from high to low and outputs the square wave. In the next cycle, since the sign of a difference value f0-e0 between a pulse width f0 in this cycle and the pulse width in the immediately preceding cycle is similarly − (minus), the signal processing unit 306 outputs the square wave while maintaining the state of the square wave to low.

Note that, in the aforementioned description, a condition of switching the state of the square wave from high to low is described to be a timing at which the difference value of the pulse widths of the PWM wave has changed from plus to minus. Moreover, a condition of switching the state of the square wave from low to high is described to be a timing at which the difference value of the pulse widths of the PWM wave has changed from minus to plus. However, these conditions may be interchanged. Specifically, the condition of switching the state of the square wave from high to low may be the timing at which the difference value of the pulse widths of the PWM wave has changed from minus to plus. In this case, the condition of switching the state of the square wave from low to high is the timing at which the difference value of the pulse widths of the PWM wave has changed from plus to minus.

Detecting the sign of the difference value of the pulse widths of the PWM wave enables switching of the state of the square wave at a point where the pulse of the PWM wave counted by the first counter 307 falls in the changing of the sign of the difference value. Accordingly, parts such as the filter and the amplifying circuit as in the comparative example are unnecessary and the circuit configuration can be achieved by IC functions in an application specific integrated circuit (ASIC). Thus, the circuit can be simplified.

Note that, in the case where the difference value can be determined to be very small such as the case where the absolute value of the difference value is smaller than a threshold, this difference value may be set as invalid so as not to be used for the switching of the state of the square wave. For example, the configuration may be such that a threshold i is set and a difference value smaller than the threshold i is set as invalid. This can suppress a situation where unintentional sound is generated in the case where noise is superimposed in input of a sound signal with no sound or very small volume.

FIG. 5 illustrates an example in which the absolute values of a difference value d0-c0 and a difference value j0-i0 are smaller than the threshold i and the output processing of the square wave is thus performed with these difference values set as invalid. In the case where the difference value is invalid, the signal processing unit 306 does not switch the state of the square wave and outputs the square wave in the previous state without changing it.

Note that the threshold i is changeable. Including a function of adjusting the threshold enables control of the buzzer driving depending on a degree of effect of noise on the sound signal.

Figure 6:
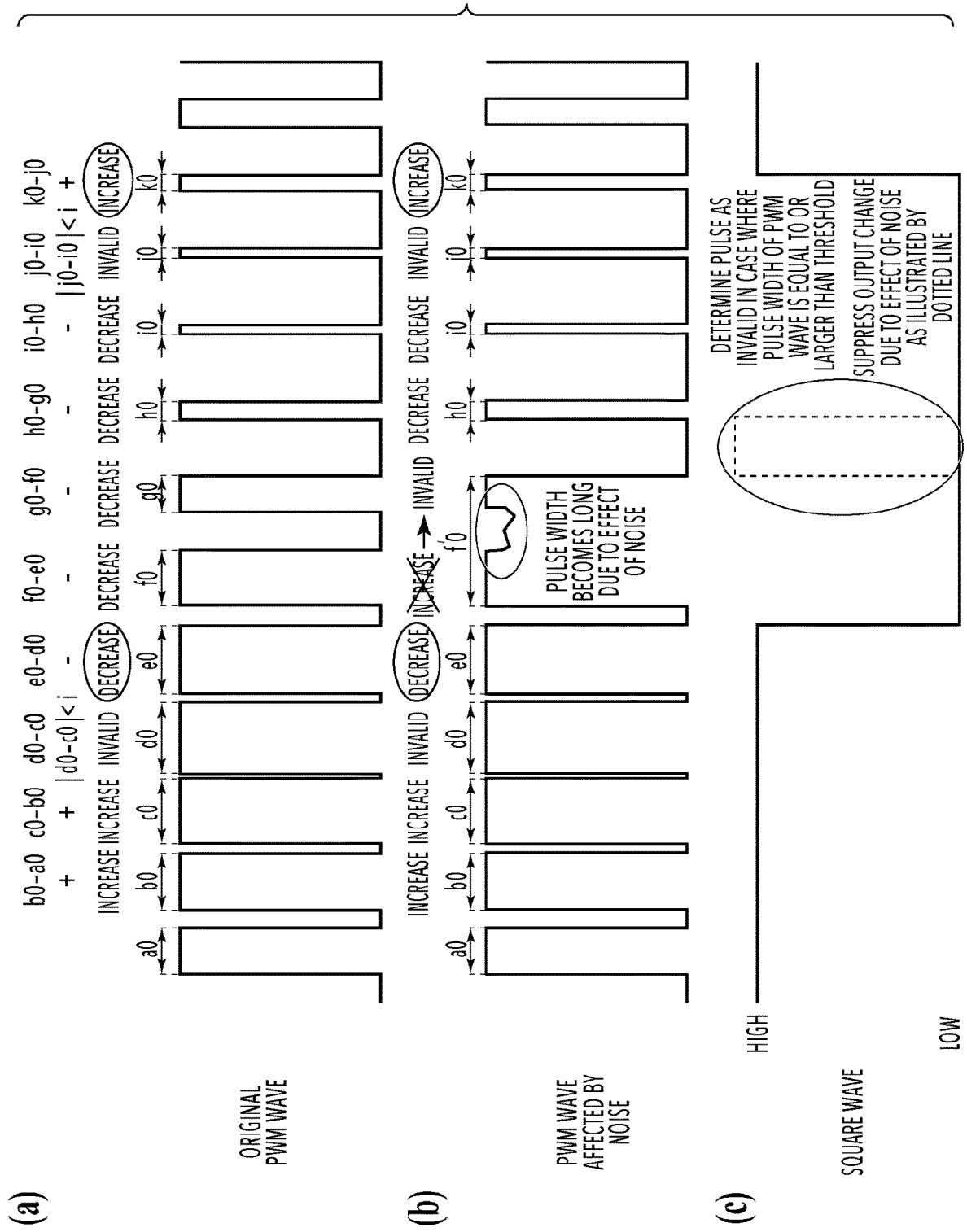
FIG. 6 is a diagram illustrating waveforms of signals in the sound signal line.

FIG. 6 is a diagram illustrating PWM waves that are output signals of the signal generation unit 123 and a square wave that is the output signal of the signal processing unit 306 based on the PWM wave. The PWM wave in FIG. 6(b) is assumed to be a PWM wave that should have been outputted with the same waveform as the PWM wave illustrated in FIG. 6(a). However, a pulse width f0 in the PWM wave of FIG. 6(b) illustrates a pulse width in the case where an original waveform including two pulses with a pulse width f0 and a pulse width g0 in FIG. 6(a) has changed to a waveform including one pulse due to an effect of excessive pulse noise.

A pulse with a large pulse width due to noise like the pulse width f0 sometimes appears during a situation where the pulse width decreases from the pulse width in the immediately preceding cycle. In this case, since the pulse width f0 is large, the sign of the difference value changes to plus, even in a situation where the pulse width should have continuously decreased and the sign of the difference value should have been minus. If the processing of switching the state of the square wave is performed at a point where the sign of the difference value changes as described above based on the PWM wave of FIG. 6(b), as illustrated in FIG. 6(c), an unintentional pulse illustrated by a dotted line is generated in the outputted square wave.

To counter this, it is possible to, for example, provide a threshold j and perform processing such that, in the case where the pulse width of the PWM wave is equal to or larger than this threshold j, the state of the square wave is not switched at a point of generation of a pulse with such a pulse width. Providing the threshold j as described above can suppress an effect of an increase of a pulse width due to noise on the square wave. Specifically, providing the threshold j can suppress generation of an unintentional pulse as illustrated by the dotted line in FIG. 6(c).

In this case, the threshold j is set larger than a cycle of the reference clock of the PWM wave. Note that the threshold j is changeable. Including a function of adjusting the threshold j enables control of the buzzer driving depending on a waveform and a degree of occurrence of the pulse noise that vary depending on a product form.

[Flowchart]

FIGS. 7A and 7B are flowcharts for explaining processing of converting the PWM wave to the square wave in the image forming apparatus 101 of the embodiment. Some or all of functions in steps of the flowchart are implemented by hardware such as an ASIC, a field programmable gate array (FPGA), or an electronic circuit in the image forming apparatus 101. Note that a sign "S" in description of processes means that the processes are the steps in the flowchart.

In S701, the function of the signal processing unit 306 is turned on. The signal processing unit 306 monitors whether an instruction to turn off the function of the signal processing unit is obtained after the turning-on and, in S702, determines whether this instruction is obtained. The instruction to turn off the function of the signal processing unit 306 is outputted from, for example, the CPU 105.

If there is no instruction to turn off the function of the signal processing unit (NO in S702), in S703 to S708, the signal processing unit 306 determines the pulse width of one cycle of the PWM wave inputted into the signal processing unit 306. S703 to S708 are a loop process and this loop process is performed every time the pulse of the PWM wave is generated to determine the pulse width.

First, in S703, the signal processing unit 306 determines whether rise of the inputted PWM wave is detected. If the rise of the PWM wave is detected (YES in S703), in S704, the first counter 307 starts counting and the counting of the time in which the state of the PWM wave is high is started. In S705, the signal processing unit 306 determines whether fall of the PWM wave is detected. In the case where the fall is detected (YES in S705), in S706, the first counter 307 stops the counting. In S707, the signal processing unit 306 determines the pulse width of the PWM wave from a count value of the first counter 307 and stores the determined pulse width. In S708, the signal processing unit 306 clears the count value of the first counter 307.

In S709, the signal processing unit 306 determines whether the determined pulse width of the PWM wave is equal to or larger than the threshold j. If the determined pulse width is equal to or larger than the threshold j (YES in S709), the pulse in this case is not the pulse to be used for the determination of whether to switch the output of the square wave from high to low or from low to high, and the processing thus returns to S702.

In the case where the determined pulse width of the PWM wave is smaller than the threshold j (NO in S709), in S710, the signal processing unit 306 subtracts the pulse width of the PWM wave in the immediately preceding cycle from the pulse width determined in S707 of the current loop process to calculate the difference value. Note that, in the case where the pulse width in the immediately preceding cycle is absent, the processing returns to S702 and the pulse width in the next cycle is determined.

In S711, the signal processing unit 306 determines whether the absolute value of the difference value is equal to or smaller than the threshold i. In the case where the absolute value of the difference value is equal to or smaller than the threshold i (YES in S711), the pulse whose pulse width is determined in S707 of the current loop process is not the pulse to be used for the determination of whether to switch the state of the square wave, and the processing thus returns to S702.

In the case where the absolute value of the difference value is larger than the threshold i (NO in S711), in S712, the signal processing unit 306 determines whether the pulse-minus sign of the difference value has changed from the sign of the difference value calculated for the pulse of the PWM wave in the immediately preceding cycle. If the sign of the difference value has not changed (NO in S712), the pulse in this case is not the pulse to be used for the switching of the state of the square wave, and the processing thus returns to S702.

If the sign of the difference value has changed (YES in S712), in S713, the signal processing unit 306 determines whether the change of the sign of the difference value is a change from negative (minus) to positive (plus). Note that, in the case where the polarity of the square wave is desired to be reversed, in this step, the signal processing unit 306 determines whether the change of the sign is a change from positive to negative.

In the case where the change of the sign of the difference value is the change from negative to positive (YES in S713), in S714, the signal processing unit 306 switches the state of the square wave from low to high and outputs the square wave. Then, in S715, since the time in which the state of the square wave is high is to be counted, the second counter 308 starts the counting and the processing returns to S702.

In the case where the change of the sign of the difference value is not the change from negative to positive (NO in S713), the change of the sign of the difference value is the change from positive to negative and the state of the square wave is thus switched from high to low. Accordingly, first, in S716, the second counter 308 stops the counting and the counting of the time in which the square wave is in the high state is stopped. In S717, the signal processing unit 306 determines the pulse width of the square wave to be outputted, from the count value of the second counter 308. In S718, the signal processing unit 306 switches the state of the square wave from high to low at such a timing that the pulse width of the pulse becomes the pulse width determined in S717. Then, in S719, the signal processing unit 306 clears the count value of the second counter 308 and the processing returns to S702.

Meanwhile, in the case where there is an instruction to turn off the function of the signal processing unit (YES in S702), in S720, the signal processing unit 306 clears the count values of the first counter 307 and the second counter 308. Then, in S721, the signal processing unit 306 sets the state of the square wave to low and, in S722, the function of the signal processing unit 306 is turned off.

Note that, in the aforementioned flowchart, description is given assuming that the state of the square wave is switched from high to low depending on the timing of the count value of the second counter 308. Alternatively, the square wave may be outputted with the state thereof switched from high to low at the timing at which the signal processing unit 306 determines that the sign of the difference value has changed from plus to minus. In this case, the configuration may be such that S715, S716, S717, and S719 are skipped and, in S718, the signal processing unit 306 switches the state of the square wave from high to low and outputs the square wave.

As described above, in the embodiment, the square wave is generated by causing the signal processing unit to detect the point where the pulse width of the PWM wave changes from the increasing state to the decreasing state or from the decreasing state to the increasing state. Accordingly, in the embodiment, waveform conversion to the sine wave is unnecessary in the process of converting the sound signal to the square wave. Accordingly, filters such as LPF and DC cut and parts such as AMP serving as an amplifying circuit are unnecessary and the circuit can be simplified. According to the technique of the present disclosure, it is possible to reduce complexity of a circuit in an apparatus that controls a buzzer.

Second Embodiment

In the method of the first embodiment, in the case where the user disconnects a cable of the telephone line with the facsimile function of the image forming apparatus set to an off-hook state, a DC voltage is sometimes continuously applied to the buzzer 118. If the DC voltage is continuously applied to the buzzer 118, there is a risk that the buzzer 118 is destroyed due to sliver migration. Accordingly, in the embodiment, description is given of a method of switching the state of the square wave to low if the situation where the square wave is outputted in the high state continues. The embodiment is described while focusing on differences from the first embodiment. Portions that are not particularly described are the same configurations and processes as those in the first embodiment.

Figure 8:
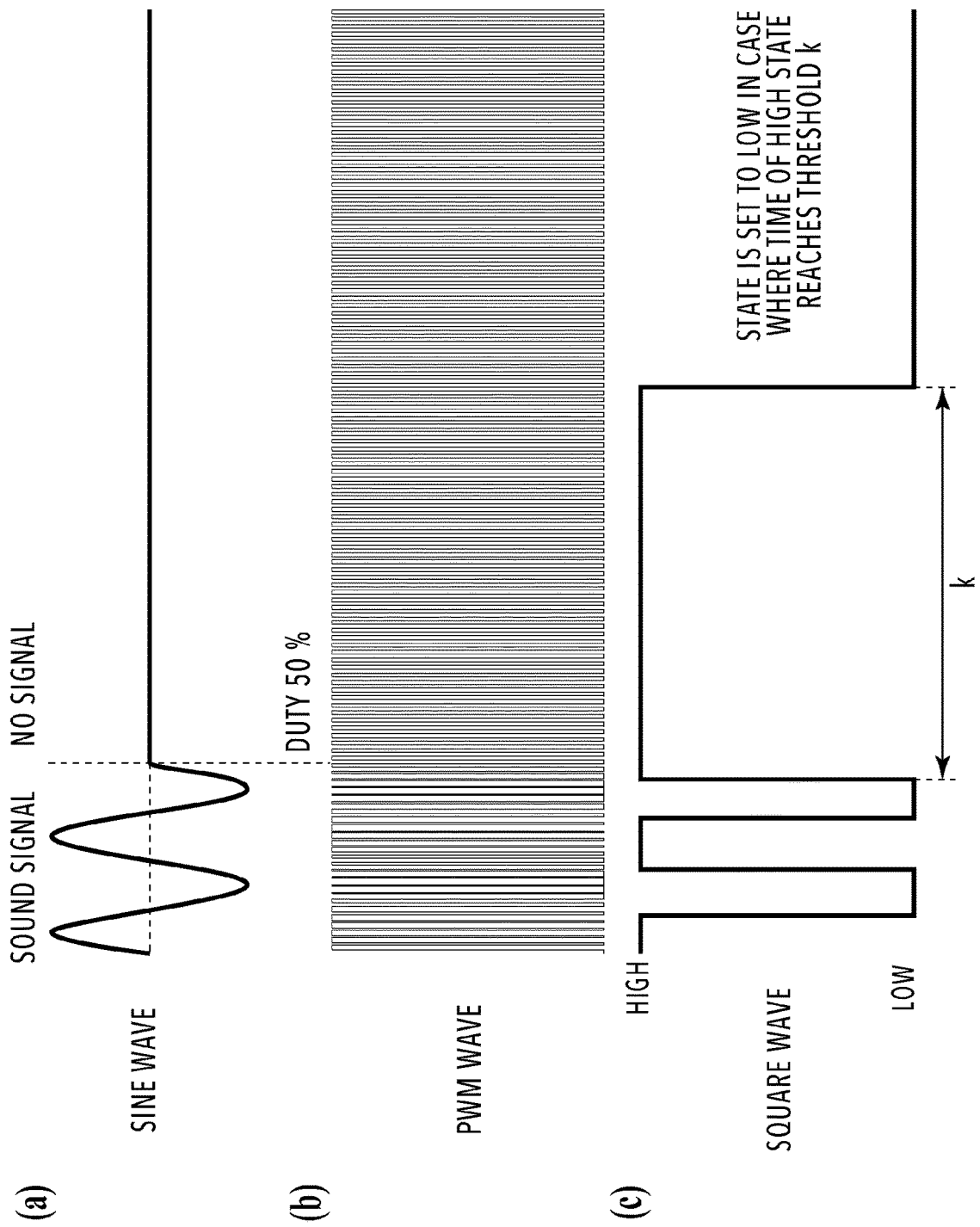
FIG. 8 is a diagram illustrating waveforms of signals in the sound signal line.

FIG. 8 is a diagram for explaining waveforms in the sound signal line. FIG. 8(a) is a diagram illustrating a sine wave that is the sound signal outputted from the telephone line 120. FIG. 8(b) is a diagram illustrating a PWM wave that is the signal outputted from the signal generation unit 123. FIG. 8(c) is a diagram illustrating a square wave that is the signal outputted from the signal processing unit 306.

FIG. 8(a) illustrates a situation where output of the sound signal from the telephone line 120 stops in the middle and the sound signal falls into a no-signal state. In the case where the sound signal falls into the no-signal state, as illustrated in FIG. 8(b), the PWM wave corresponding to the no-signal signal state is outputted as a signal of duty 50% with substantially no change in the pulse width.

Specifically, in the case where the PWM wave becomes the signal of duty 50%, the difference value between the pulse width and the pulse width in the immediately preceding cycle becomes 0. In the case where the threshold i is set, the difference value is equal to or smaller than the threshold i and is processed as invalid. Accordingly, the signal processing unit 306 continuously outputs the square wave in the state of the square wave outputted just before the point where the PWM wave becomes the signal of duty 50%.

For example, in the case where the state of the square wave generated by the signal processing unit 306 just before the point where the PWM wave becomes the signal of duty 50% is high, the square wave is continuously outputted in the high state after the point where the PWM wave becomes the signal of duty 50%. In this case, the DC voltage is continuously applied to the buzzer 118 until the next sound signal from the telephone line 120 is generated. Particularly, in the case where the buzzer 118 is a piezoelectric buzzer, the continuous application of the DC voltage causes silver migration due to the characteristics of the piezoelectric buzzer and the buzzer 118 may be destroyed.

Accordingly, the signal processing unit 306 of the embodiment has a function of avoiding the situation where the DC voltage is continuously applied to the buzzer 118. In the embodiment, the second counter 308 counts the time in which the outputted square wave is in the high state and, if the time in which the square wave is in the high state reaches a threshold k, the signal processing unit 306 switches the state of the square wave to low.

The threshold k is set to a value equal to or larger than the maximum cycle of the sound signal. Moreover, the threshold k may be changeable. Including a function of adjusting the threshold k allows the signal processing unit 306 to perform processing of outputting the square wave adapted to the tolerance of the buzzer 118 to the DC voltage.

Figure 9A:
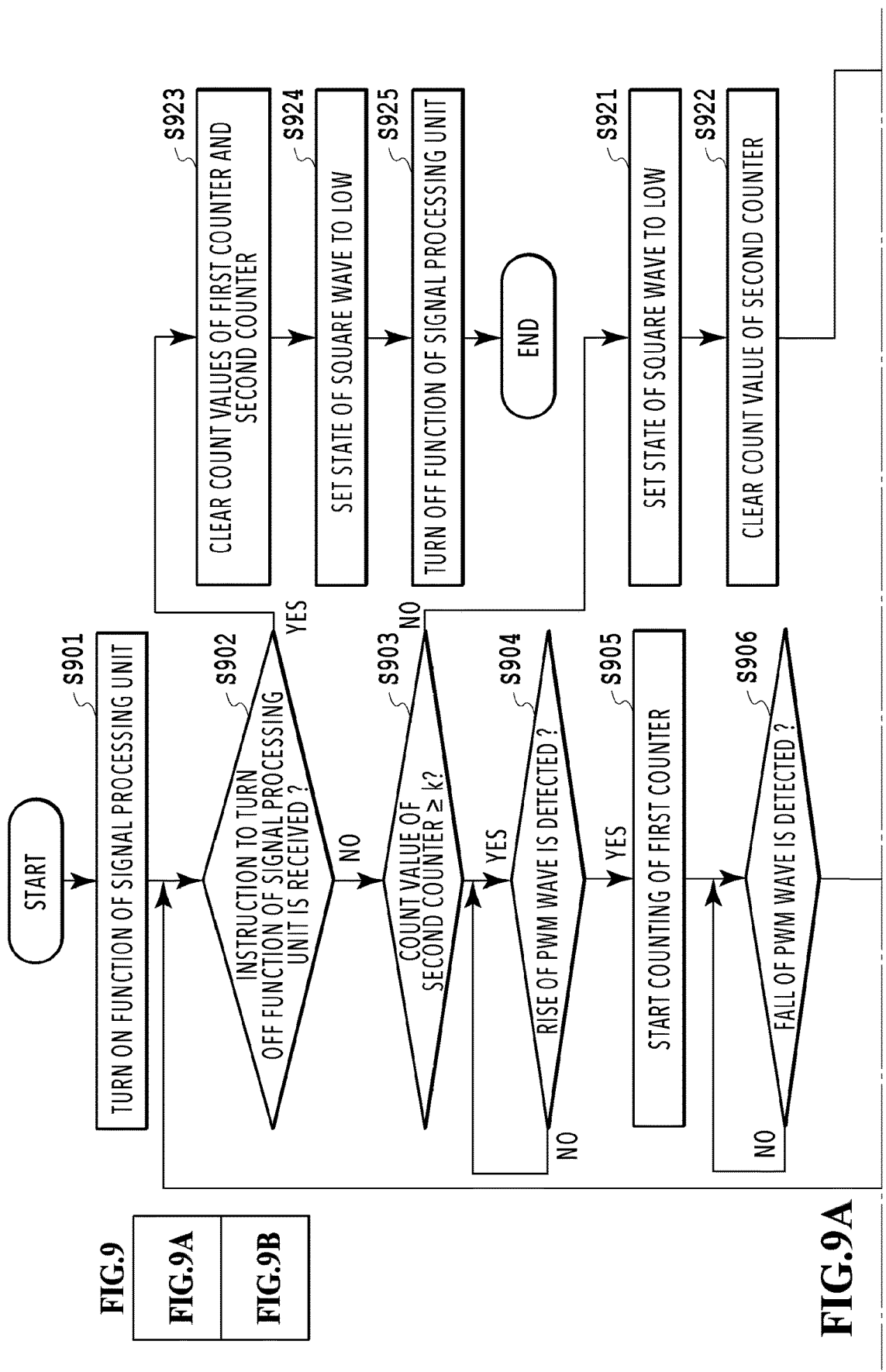
FIG. 9A is a flowchart illustrating processing of obtaining the square wave from the PWM wave and outputting the square wave.
Figure 9B:
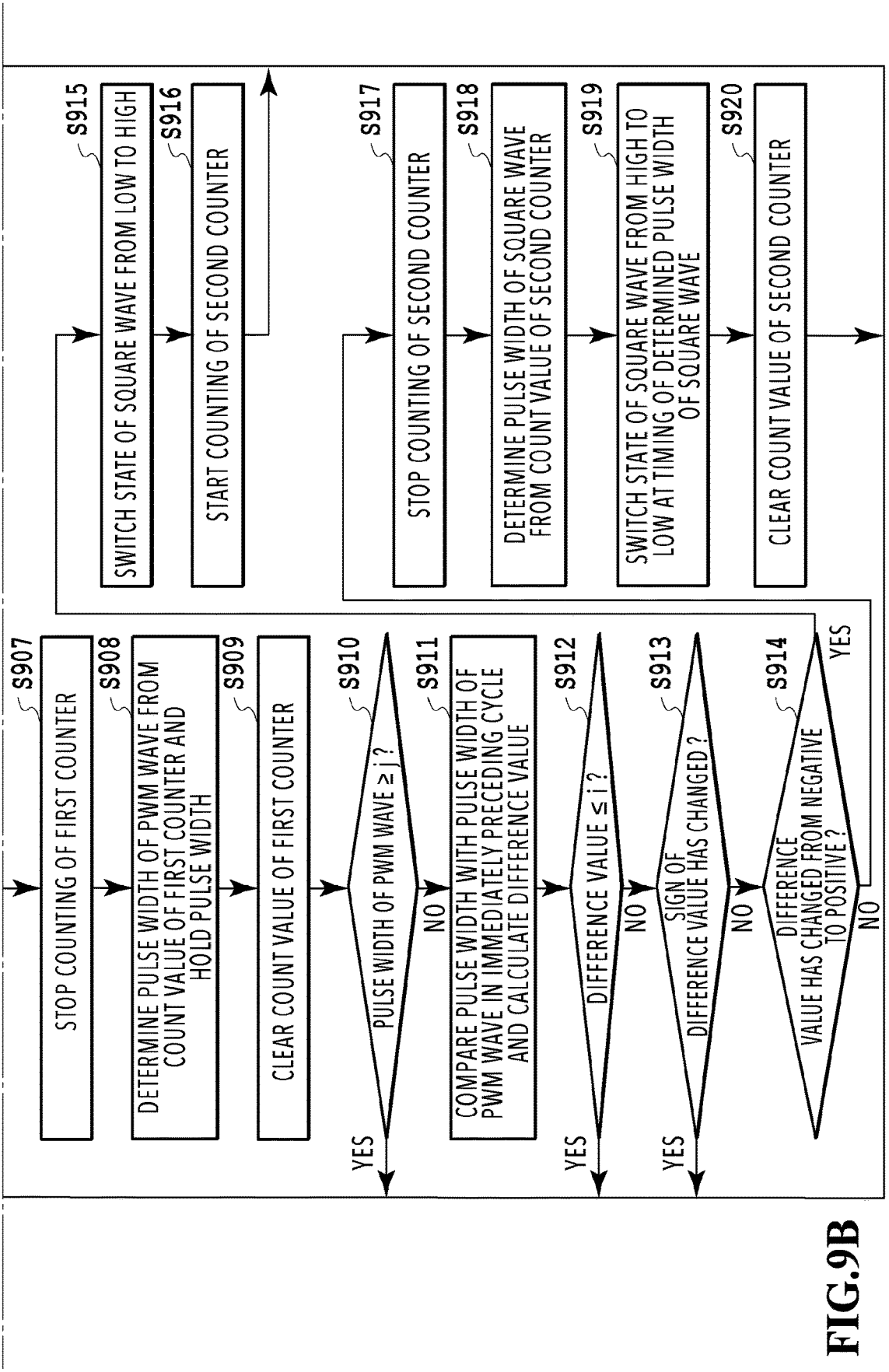
FIG. 9B is a flowchart illustrating processing of obtaining the square wave from the PWM wave and outputting the square wave.

FIGS. 9A and 9B are flowcharts for explaining processing of converting the PWM wave to the square wave in the embodiment. Processes of S901 and S902 are the same as S701 and S702 and processes of S904 to S920 are the same as S703 to S719. Thus, descriptions of these processes are omitted.

For example, in S915, the signal processing unit 306 switches the state of the square wave to high, then, in S916, the second counter starts counting the time in which the state of the square wave is high, and the processing returns to S902. Then, if the instruction to turn off the function of the signal processing unit is not obtained in S902, the processing proceeds to S903.

In S903, the signal processing unit 306 determines whether the current count value of the second counter 308 counting the time in which the state of the square wave is high is equal to or longer than the threshold k. Specifically, every time the processing returns to S902 due to completion of the steps of S903 and beyond and then the signal processing unit 306 determines that the instruction to turn off the function of the signal processing unit is not obtained in S902, in S903, the signal processing unit 306 determines whether the count value of the second counter 308 is equal to or longer than the threshold k.

If the time in which the state of the square wave is high is equal to or longer than the threshold k (YES in S903), the time in which the square wave is outputted in the high state is long and thus, in S921, the signal processing unit 306 switches the output of the square wave to the low state. Then, in S922, the count value of the second counter 308 is cleared and the processing returns to S902.

If the signal processing unit 306 switches the state of the square wave to low in S919 as a result of the comparison of the signs of the difference values, in the subsequent S920, the count value of the second counter 308 is cleared and the processing returns to S902. Accordingly, in S903 after the returning to the S902, the signal processing unit 306 does not determine that the count value of the second counter 308 is equal to or longer than the threshold k.

In the case where the time in which the state of the square wave is high is shorter than the threshold k (NO in S903), the processing proceeds to S904. As described above, the following processes are the same as those in the steps in the flowchart of FIGS. 7A and 7B. Note that, since S923 to S925 are the same as S720 to S722, the description thereof is omitted.

As described above, according to the embodiment, it is possible to suppress the case where the DC voltage is continuously applied to the buzzer 118.

Third Embodiment

In the case where a sound signal of a uniform frequency is inputted and fluctuation of a PWM wave outputted by the signal generation unit based on the inputted sound signal is great, jitter occurs and the user hears uncomfortable sound in some cases. In one embodiment, the buzzer generates sound at a fixed frequency in the case where the sound signal of the uniform frequency is inputted. Accordingly, in this embodiment, description is given of a method in which the pulse width of the square wave generated in the signal processing unit is held and used for the generation of the next pulse. The embodiment is described while focusing on differences from the first embodiment. Portions that are not particularly described are the same configurations and processes as those in the first embodiment.

Figure 10:
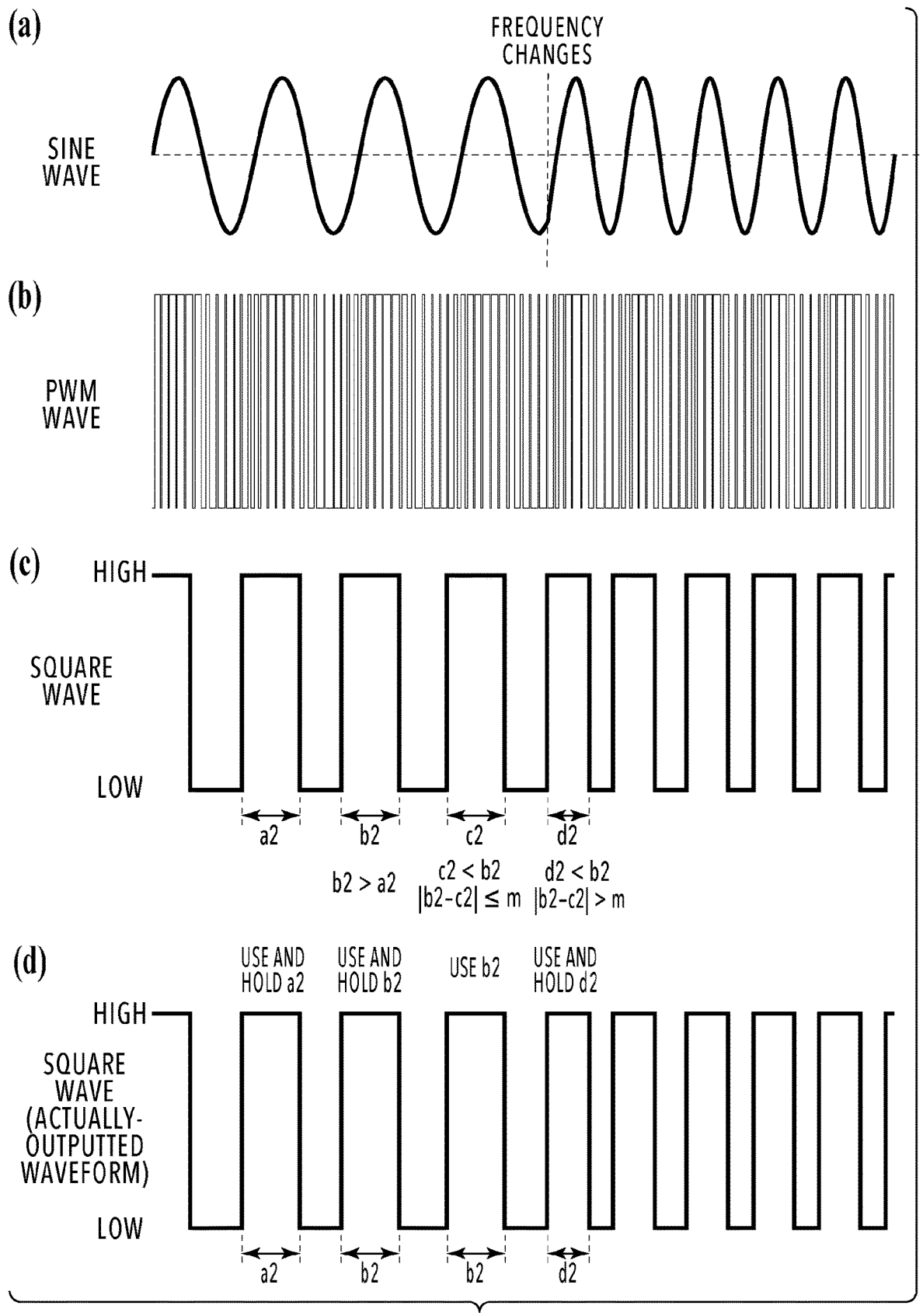
FIG. 10 is a diagram illustrating waveforms of signals in the sound signal line.

FIG. 10 is a diagram for explaining waveforms in the sound signal line. FIG. 10(a) is a diagram illustrating a sine wave that is the sound signal outputted from the telephone line 120. FIG. 10(b) is a diagram illustrating a PWM wave outputted from the signal generation unit 123.

In the case where the sound signal of the uniform frequency is inputted and the fluctuation of the PWM wave outputted by the signal generation unit 123 in this case is great, jitter occurs and the user hears uncomfortable sound. In one embodiment, the buzzer generates sound at a fixed frequency in the case where the sound signal of the uniform frequency is inputted.

FIG. 10(c) is a diagram illustrating the square wave outputted by the signal processing unit 306 based on the difference value of the pulse widths of the PWM wave as described in the first embodiment. In the embodiment, a pulse width a2 of the square wave outputted by the signal processing unit 306 is held in a memory unit such as the RAM 106. Then, in the output of the next pulse of the square wave, the signal processing unit 306 compares the held pulse width a2 and a pulse width b2 of a pulse generated in the method (method of the first embodiment) in which the state of the square wave is switched at the point where the sign of the difference value of the pulse widths of the PWM wave changes. In the case where the pulse width b2 is longer than the pulse width a2, the pulse of the square wave that is being outputted cannot be set to have the pulse width a2. Thus, the pulse that is being outputted is outputted with the pulse width b2. Then, the pulse width b2 is newly held.

Then, in the output of the next pulse of the square wave, the signal processing unit 306 compares the held pulse width b2 and a pulse width c2 of the square wave generated in the method of the first embodiment. If the pulse width c2 is shorter than the pulse width b2, the signal processing unit 306 determines whether the difference between the pulse width c2 and the pulse width b2 is very small. In the case where the absolute value of the difference between the pulse width c2 and the pulse width b2 is equal to or smaller than a threshold m and is very small, the square wave is outputted with the point of the switching to the low state shifted later such that the duration of the pulse of the square wave that is being outputted becomes the held pulse width b2. The pulse width c2 is not held.

Then, in the output of the next pulse of the square wave, the signal processing unit 306 compares the held pulse width b2 and a pulse width d2 of the square wave generated in the method of the first embodiment. Assume that the pulse width d2 is smaller than the pulse width b2 but the absolute value of the difference between the pulse d2 and the pulse b2 is larger than the threshold m. In this case, the pulse of the square wave that is being outputted is outputted with the pulse width d2. Then, the pulse width d2 is held.

As illustrated in FIG. 10(a), the frequency of the sine wave of the sound signal outputted from the telephone line is changing while the pulse of the square wave is outputted with the pulse width d2. As described above, in the case where the absolute value of the difference between the pulse width d2 and the pulse width b2 is larger than the threshold m, the square wave is outputted in the method described in the first embodiment. The square wave can be thereby outputted with the pulse width of the square wave changed in the case where the frequency of the sound signal has changed. The threshold m is set smaller than the minimum value between a cycle and another cycle of the sound signal.

FIG. 10(d) is a square wave outputted by the signal processing unit 306 of the embodiment. Compared to the square wave illustrated in FIG. 10(c) and outputted by the method of the first embodiment, the pulses with the pulse width b2 are successively outputted in the FIG. 10(d). Accordingly, the buzzer can be made to generate sound at a fixed frequency.

Note that the threshold m may be changeable. Including a function of adjusting the threshold m allows the signal processing unit 306 to perform processing of outputting the square wave depending on a degree of fluctuation in the PWM wave outputted from the signal generation unit.

Figure 11B:
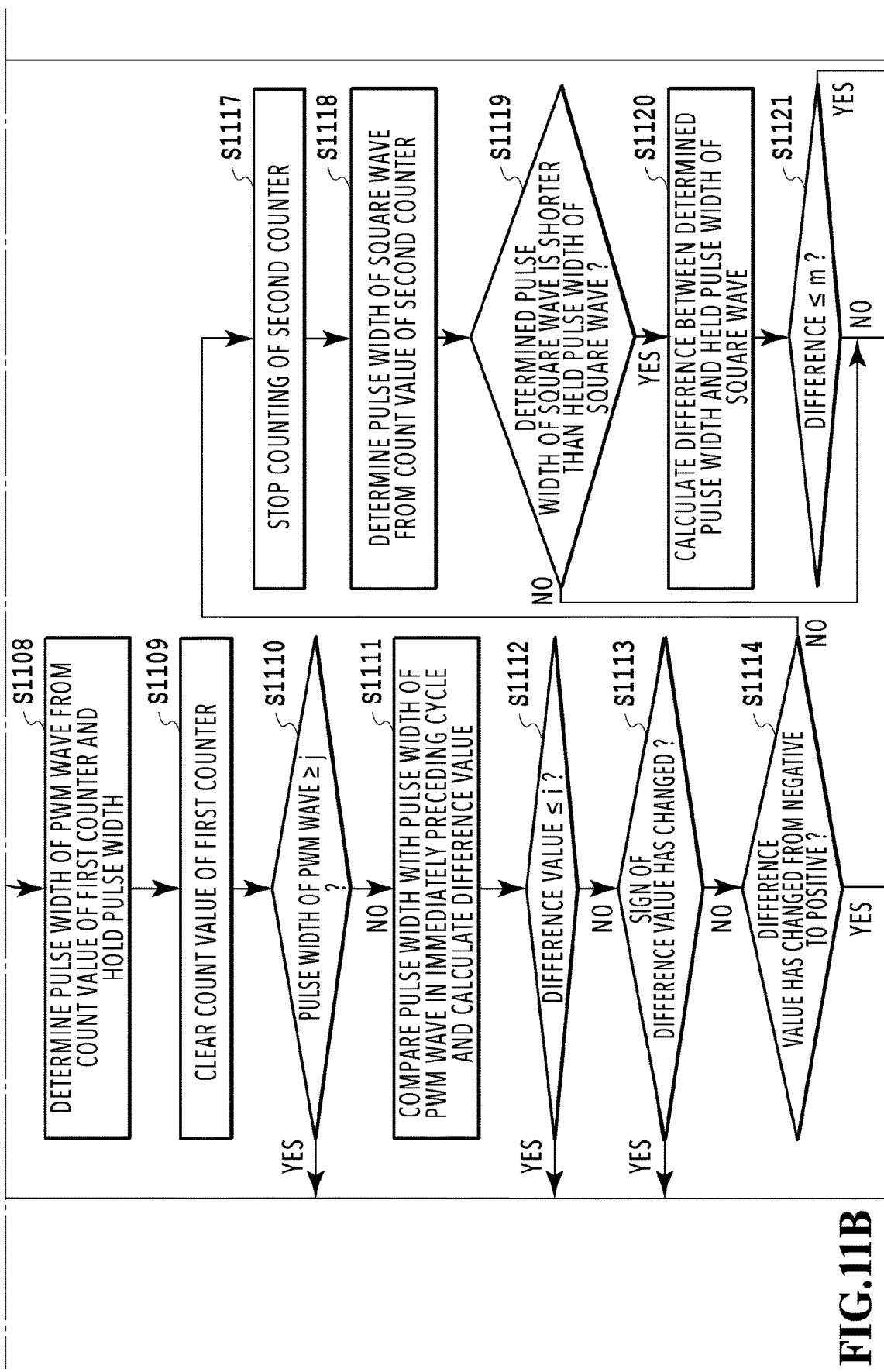
FIG. 11B is a flowchart illustrating processing of obtaining the square wave from the PWM wave and outputting the square wave.
Figure 11C:
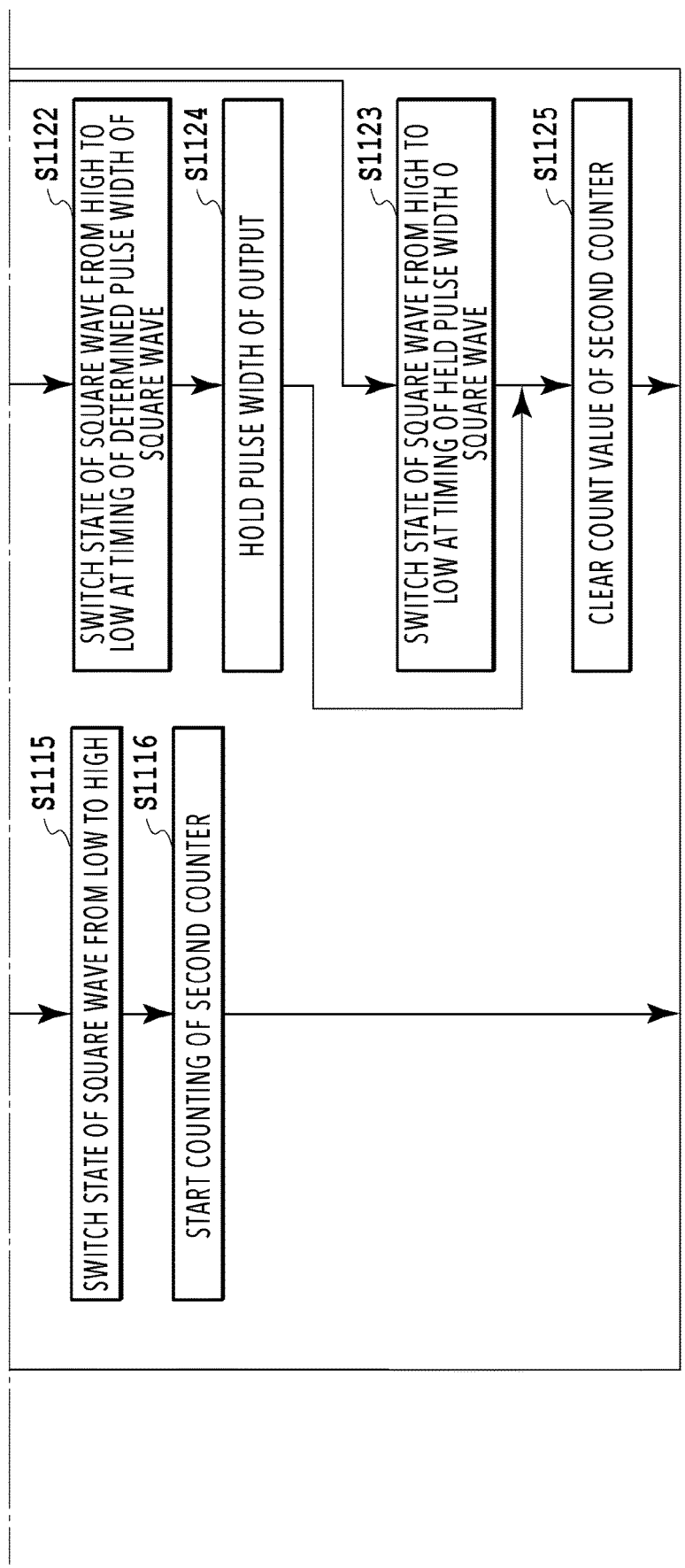
FIG. 11C is a flowchart illustrating processing of obtaining the square wave from the PWM wave and outputting the square wave.

FIGS. 11A to 11C are flowcharts for explaining processing of converting the PWM wave to the square wave in the embodiment. Note that, in the flowchart of FIGS. 11A to 11C, description is given while including the function described in the second embodiment. Processes of S1101 to S1118 are the same as S901 to S918 and processes of S1126 to S1130 are the same as S921 to S925. Accordingly, description of these processes is omitted.

In the case where the signal processing unit 306 switches the state of the square wave to high in S1115 as in FIGS. 9A and 9B, in S1116, the second counter 308 starts counting the state in which the square wave is outputted in the high state, that is, the pulse width of the outputted square wave, and the processing returns to S1102.

Then, if the sign of the difference value of the pulse widths of the PWM wave has changed from positive to negative after the return to S1102 (NO in S1114), in S1117, the second counter 308 stops the counting. Then, in S1118, the signal processing unit 306 determines the pulse width of the square wave in the case of output in the method of the first embodiment, from the count value of the second counter 308. The processes up to this point are the same as those in the aforementioned embodiments.

In the embodiment, the previous pulse width of the square wave outputted in the high state is held. Accordingly, in S1119, the signal processing unit 306 determines whether the pulse width of the square wave determined in S1118 is shorter than the held pulse width of the square wave, that is whether the held pulse width of the square wave is longer than the determined pulse width.

In the case where the held pulse width of the square wave is longer than the determined pulse width (YES in S1119), the processing proceeds to S1120. In S1120, the signal processing unit 306 calculates the difference between the held pulse width of the square wave and the pulse width of the square wave determined in S1118 and, in S1121, determines whether the absolute value of the difference is equal to or smaller than the threshold m.

If the absolute value is equal to or smaller than the threshold m (YES in S1121), it is possible to assume that the held pulse width is substantially the same value as the pulse width determined in S1118. Accordingly, in 51123, the signal processing unit 306 switches the state of the square wave from high to low at such a point that the pulse width of the currently-outputted pulse of the square wave becomes the held pulse width, and the processing proceeds to S1125.

Meanwhile, if the held pulse width of the square wave is shorter than the determined pulse width (NO in S1119), the pulse width of the outputted square wave cannot be set to the held pulse width in terms of time even if the value of the held pulse width and the value of the pulse width determined in S1118 are substantially the same. Accordingly, the processing proceeds to S1122. The processing proceeds to S1122 also in the case where the difference is larger than the threshold m (NO in S1121).

In S1122, the signal processing unit 306 switches the state of the square wave from high to low at such a point that the pulse width of the outputted square wave becomes the pulse width determined in S1118. Then, the processing proceeds to S1124. In S1124, the pulse width of the square wave determined in S1118 of this loop process is held. Specifically, the pulse width of the square wave outputted in this loop process is held. In the case where the previous pulse width is held, the held value is updated. Then, the processing proceeds to S1125. In S1125, the count value of the second counter 308 is cleared and the processing returns to S1102.

As described above, according to the embodiment, it is possible to suppress changing of pulses of the square wave due to fine fluctuation in the PWM wave. Accordingly, it is possible to suppress occurrence of harsh sound due to jitter and suppress a decrease in sound quality of the buzzer.

Other Embodiments

Although the aforementioned embodiments are described assuming that the buzzer and the control unit including the signal processing unit are included in the same apparatus, the control unit may control a buzzer in another apparatus by using the generated square wave. Specifically, apparatuses in which the embodiments are carried out include a buzzer control apparatus that controls notification by a buzzer included in apparatuses such as a facsimile communication apparatus and a vehicle approach notification apparatus.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-094487, filed May 29, 2020, which is hereby incorporated by reference wherein in its entirety.

What is claimed is:

1. An apparatus that controls a buzzer by using a square wave, comprising:
   a generation unit configured to generate a PWM (pulse width modulation) wave based on a sound signal; and
   a processing unit configured to convert the generated PWM wave to the square wave, wherein
   the processing unit includes:
   a first determination unit configured to determine a pulse width of the PWM wave;
   a comparison unit configured to compare a first difference value and a second difference value, the first difference value obtained by subtracting the pulse width of the PWM wave in a second cycle from the pulse width of the PWM wave in a first cycle, the second cycle being a cycle immediately preceding the first cycle, the second difference value obtained by subtracting the pulse width in a cycle immediately preceding the second cycle from the pulse width in the second cycle; and
   an output unit configured to output the square wave while switching a state of the square wave in a case where a sign of the first difference value changes from a sign of the second difference value, wherein
   in a case where the sign of the second difference value is positive and the sign of the first difference value changes to negative, the output unit switches the state of the square wave from high to low and outputs the square wave, and
   in a case where the sign of the second difference value is negative and the sign of the first difference value changes to positive, the output unit switches the state of the square wave from low to high and outputs the square wave.

2. The apparatus according to claim 1, wherein, in a case where the sign of the first difference value changes from the sign of the second difference value, the output unit switches the state of the square wave at a point where the pulse of the PWM wave in the first cycle falls.

3. The apparatus according to claim 1, wherein, in a case where an absolute value of the first difference value is equal to or smaller than a first threshold, the output unit does not switch the state of the square wave even if the sign of the first difference value changes from the sign of the second difference value.

4. The apparatus according to claim 3, wherein the first threshold is changeable.

5. The apparatus according to claim 1, wherein, in a case where the pulse width in the first cycle is equal to or larger than a second threshold, the output unit does not switch the state of the square wave even if the sign of the first difference value changes from the sign of the second difference value.

6. The apparatus according to claim 5, wherein the second threshold is changeable.

7. The apparatus according to claim 1, wherein, in a case where the square wave has been outputted in a high state for a period of a third threshold or more, the output unit switches the state of the square wave to low.

8. The apparatus according to claim 7, wherein the third threshold is changeable.

9. The apparatus according to claim 1, wherein the buzzer is a piezoelectric buzzer.

10. The apparatus according to claim 1, wherein
    the processing unit further includes:
    a second determination unit configured to, in a case where the state of the outputted square wave is high and the sign of the first difference value changes to negative while the sign of the second difference value is positive, determine the pulse width of the square wave to be generated by switching of the state of the square wave to low, in response to the changing of the sign of the first difference value to negative;
    a holding unit configured to hold the pulse width of the square wave last outputted by the output unit; and
    a calculation unit configured to calculate a difference between the pulse width determined by the second determination unit and the held pulse width, and
    wherein, in a case where the pulse width determined by the second determination unit is shorter than the held pulse width and an absolute value of the difference is equal to or smaller than a fourth threshold, the output unit switches the state of the square wave from high to low at such a timing that the pulse width of the square wave becomes the held pulse width.

11. The apparatus according to claim 10, wherein the fourth threshold is changeable.

12. The apparatus according to claim 1, further comprising a switching unit configured to perform switching between a line used to generate an operation sound and a line used to generate a sound signal of a telephone line.

13. A facsimile communication apparatus that controls a buzzer by using a square wave, comprising:
    a generation unit configured to generate a PWM (pulse width modulation) wave based on a sound signal; and a processing unit configured to convert the generated PWM wave to the square wave, wherein the processing unit includes:

a determination unit configured to determine a pulse width of the PWM wave;

a comparison unit configured to compare a first difference value and a second difference value, the first difference value obtained by subtracting the pulse width of the PWM wave in a second cycle from the pulse width of the PWM wave in a first cycle, the second cycle being a cycle immediately preceding the first cycle, the second difference value obtained by subtracting the pulse width in a cycle immediately preceding the second cycle from the pulse width in the second cycle; and an output unit configured to output the square wave while switching a state of the square wave in a case where a sign of the first difference value changes from a sign of the second difference value, wherein in a case where the sign of the second difference value is positive and the sign of the first difference value changes to negative, the output unit switches the state of the square wave from high to low and outputs the square wave, and in a case where the sign of the second difference value is negative and the sign of the first difference value changes to positive, the output unit switches the state of the square wave from low to high and outputs the square wave.

14. A method of controlling a buzzer by using a square wave, comprising:

generating a PWM (pulse width modulation) wave based on a sound signal;

determining a pulse width of the PWM wave;

comparing a first difference value and a second difference value, the first difference value obtained by subtracting the pulse width of the PWM wave in a second cycle from the pulse width of the PWM wave in a first cycle, the second cycle being a cycle immediately preceding the first cycle, the second difference value obtained by subtracting the pulse width in a cycle immediately preceding the second cycle from the pulse width in the second cycle; and outputting the square wave while switching a state of the square wave in a case where a sign of the first difference value changes from a sign of the second difference value, wherein in a case where the sign of the second difference value is positive and the sign of the first difference value changes to negative, the outputting switches the state of the square wave from high to low and outputs the square wave, and in a case where the sign of the second difference value is negative and the sign of the first difference value changes to positive, the outputting switches the state of the square wave from low to high and outputs the square wave.

15. The method according to claim 14, wherein, in a case where the sign of the first difference value changes from the sign of the second difference value, the outputting switches the state of the square wave at a point where the pulse of the PWM wave in the first cycle falls.

16. The method according to claim 14, wherein, in a case where an absolute value of the first difference value is equal to or smaller than a first threshold, the outputting does not switch the state of the square wave even if the sign of the first difference value changes from the sign of the second difference value.

17. The method according to claim 14, wherein, in a case where the pulse width in the first cycle is equal to or larger than a second threshold, the outputting does not switch the state of the square wave even if the sign of the first difference value changes from the sign of the second difference value.

18. The method according to claim 14, wherein, in a case where the square wave has been outputted in a high state for a period of a third threshold or more, the outputting switches the state of the square wave to low.

* * * * *